(12) United States Patent
Launonen et al.

(10) Patent No.: US 10,041,507 B2
(45) Date of Patent: Aug. 7, 2018

(54) SUBSEA PRESSURE COMPENSATION ARRANGEMENT

(71) Applicant: ABB Technology AG, Zurich (CH)

(72) Inventors: Markku Launonen, Vaasa (FI); Erkki Hiironniemi, Vaasa (FI); Esa Virtanen, Vaasa (FI)

(73) Assignee: ABB Schweiz AG, Baden (CH)

( * ) Notice: Subject to any disclaimer, the term of this patent is extended or adjusted under 35 U.S.C. 154(b) by 357 days.

(21) Appl. No.: 14/723,665

(22) Filed: May 28, 2015

(65) Prior Publication Data

US 2015/0260203 A1    Sep. 17, 2015

Related U.S. Application Data

(63) Continuation of application No. PCT/EP2013/074271, filed on Nov. 20, 2013.

(30) Foreign Application Priority Data

Nov. 28, 2012 (EP) ..................................... 12194593

(51) Int. Cl.
| | |
|---|---|
| F16L 55/04 | (2006.01) |
| F15B 1/24 | (2006.01) |
| H01F 27/14 | (2006.01) |
| E21B 41/00 | (2006.01) |
| H01F 38/00 | (2006.01) |
| H05K 5/06 | (2006.01) |

(52) U.S. Cl.
CPC ............ F15B 1/24 (2013.01); E21B 41/0007 (2013.01); H01F 27/14 (2013.01); H01F 38/00 (2013.01); H05K 5/068 (2013.01)

(58) Field of Classification Search
CPC ............................... F15B 1/24; F21B 41/0007
USPC ........................................................... 138/30
See application file for complete search history.

(56) References Cited

U.S. PATENT DOCUMENTS 4,997,009 A * 3/1991 Niikura ............. B60G 17/0424
                                                          138/30
5,797,430 A * 8/1998 Becke ................. F04B 11/0016
                                                          138/26

(Continued)

FOREIGN PATENT DOCUMENTS

| AT | 357 631 B    | 7/1980 |
| EP | 2 169 690 A1 | 3/2010 |
| EP | 2 402 962 A1 | 1/2012 |

OTHER PUBLICATIONS

Machine Translation of AT357631.*

(Continued)

*Primary Examiner* — Vishal Pancholi
(74) *Attorney, Agent, or Firm* — Taft Stettinius & Hollister LLP; J. Bruce Schelkopf

(57) ABSTRACT

A subsea pressure compensation arrangement is disclosed as having a vessel filled with insulating fluid, and a pressure compensator for compensating pressure variations of the insulating fluid. The arrangement can include a fluid connection pipe for fluid communication between the vessel and the pressure compensator, wherein the fluid connection pipe is connected to a bottom wall of the pressure compensator. A pipe opening arranged at an end of the fluid connection pipe extends above a level of the bottom wall of the pressure compensator.

10 Claims, 4 Drawing Sheets

(56) References Cited

U.S. PATENT DOCUMENTS

| | | | |
|---|---|---|---|
| 2004/0051615 A1* | 3/2004 | Hafskjold | E21B 33/0385 336/57 |
| 2011/0203379 A1 | 8/2011 | Virtanen et al. | |
| 2011/0226369 A1 | 9/2011 | Uusipaikka | |
| 2012/0001712 A1 | 1/2012 | Puchianu et al. | |
| 2013/0167962 A1* | 7/2013 | Skjetne | F16L 55/04 138/30 |

OTHER PUBLICATIONS

International Search Report (PCT/ISA/210) dated Jan. 2, 2014, by the European Patent Office as the International Searching Authority for International Application No. PCT/EP2013/074271.

* cited by examiner

US 10,041,507 B2

SUBSEA PRESSURE COMPENSATION ARRANGEMENT

RELATED APPLICATION

This application claims priority as a continuation application under 35 U.S.C. § 120 to PCT/EP2013/074271 which was filed as an International Application on Nov. 20, 2013 designating the U.S., and which claims priority to European Application 12194593.5 filed in Europe on Nov. 28, 2012. The entire contents of these applications are hereby incorporated by reference in their entireties.

FIELD

The present disclosure relates to a pressure compensation arrangement for use in a subsea environment, such as in a non-water fluid filled device or assembly.

BACKGROUND INFORMATION

Subsea electric installations, such as transformers or frequency converters, are assemblies used under water. Installations, such as transformers, can include a vessel filled with insulation and/or cooling fluid to encounter for the high pressure due to deep water depth. During operation of the installation, temperature and volume of the insulation and/or cooling fluid varies, whereby pressure compensation of the fluid is used. This involves use of a pressure compensator, which is in fluid connection with the vessel of the installation. The pressure compensator receives excess fluid when its temperature and volume increase, and returns the fluid back to the vessel when it cools down.

Leakage of seawater into the pressure compensator and/or the installation is a serious risk as it may prevent the operation of the installation or damage the installation. Improved arrangements are also needed to prevent such leakage, and minimize disadvantages if such a leakage occurs.

SUMMARY

A subsea pressure compensation arrangement is disclosed, comprising: a vessel filled with fluid; a pressure compensator for compensating volume variations of the fluid; and a fluid connection pipe for fluid communication between the vessel and the pressure compensator, wherein the fluid connection pipe is connected to a bottom wall of the pressure compensator with a pipe opening arranged at an end of the fluid connection pipe extending above a level of the bottom wall of the pressure compensator, the pressure compensator being a bellow compensator having one or more foldable and/or flexible side walls for allowing volume variations of the bellow compensator, and the pipe opening of the fluid connection pipe being arranged in a proximity of, but separate from, a top wall of the bellow compensator when the bellow compensator is in its contracted state.

BRIEF DESCRIPTION OF THE DRAWINGS

In the following discussion, features and advantages disclosed herein will be described in greater detail by way of exemplary embodiments with reference to the accompanying drawings, in which.

DETAILED DESCRIPTION

A pressure compensation arrangement is disclosed wherein damage risk of an installation can be diminished in a seawater leakage situation.

Exemplary embodiments relate to subsea installations. Such installations include electric installations, such as transformers and frequency converters, and hydraulic actuators, for instance.

Due to high pressure, the subsea installation is filled with insulating and/or cooling fluid, such as oil. As the temperature of the fluid varies, its volume varies accordingly, whereby pressure compensation is used. A pressure compensator is provided, which receives the excess fluid that does not fit into the vessel when the volume of the fluid content increases due to the increased temperature. At cooling of the fluid, the pressure compensator returns the fluid to the vessel.

In an exemplary embodiment, the pressure compensation is carried out by bellow compensators, where the volume and outer dimensions of the compensator change by expansion and contraction of the compensator. The bellow compensator can include a foldable and/or flexible side wall, whereby the volume and the outer dimensions of the compensator can change. The side wall can be made of metal, rubber or some other corresponding material. In the case of the metallic bellow, the volume expansion and compression can occur in the axial direction only. In the case of rubber or similar bellow compensator, some of the volume expansion may additionally occur in the radial direction too.

The bellow compensator may have a single- or multiwall structure. There may, for instance, be two or more overlapping bellows. In a multilayer structure, the different layers may be made of the same or different materials. For instance, in a two-wall bellow, there may be two overlapping metal walls, or there may be one rubber and one metal wall.

Figure 1:
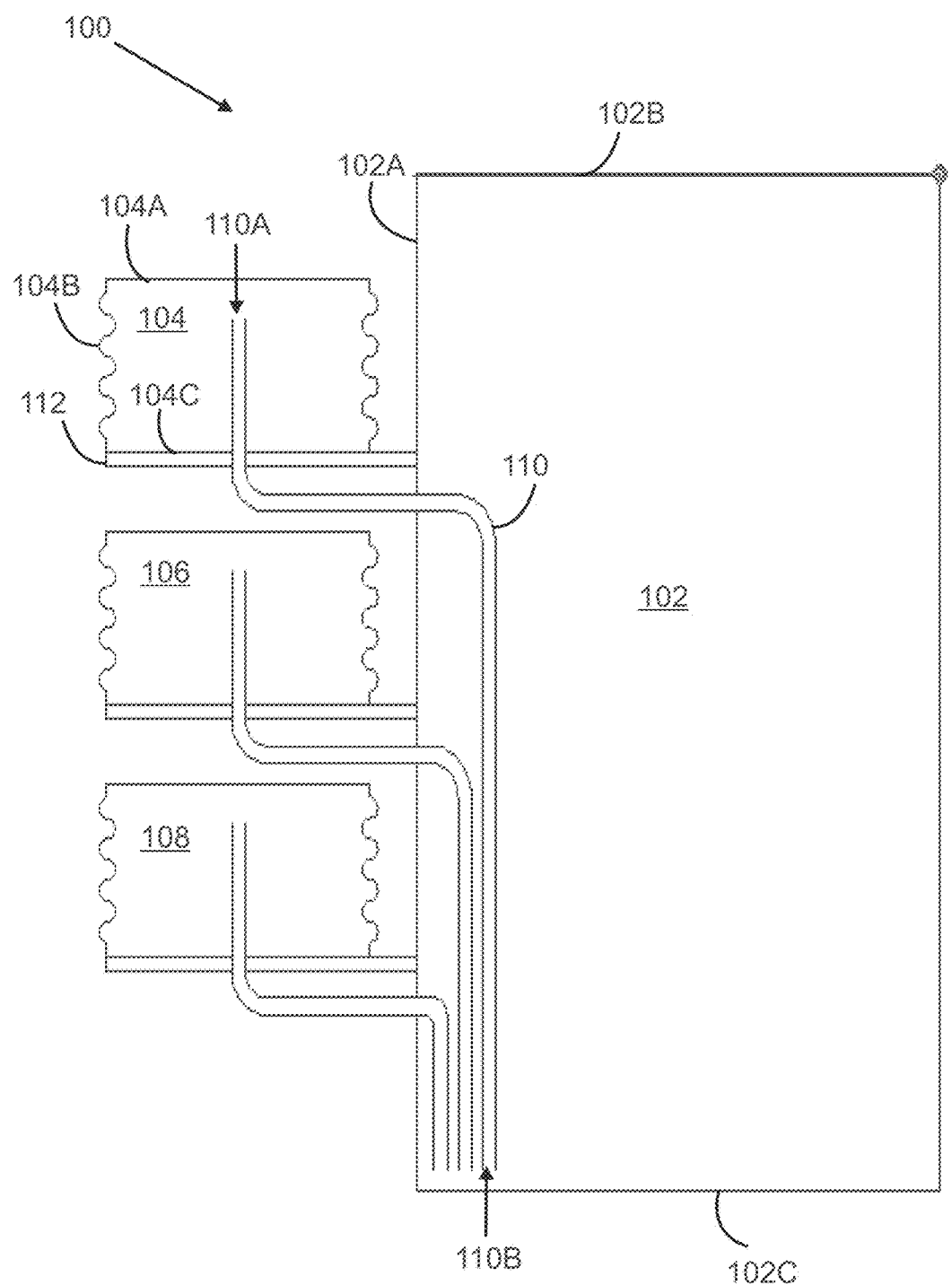
FIG. 1 shows an exemplary embodiment of a pressure compensation arrangement.

FIG. 1 shows an exemplary embodiment of a pressure compensation arrangement 100. The vessel housing the subsea installation is denoted by reference 102, and the bellow compensators by references 104, 106 and 108. In the illustrated embodiment there are three bellow compensators but the number of bellow compensators is naturally not limited to three but can be one or any number greater than that.

The compensators are in fluid communication with the vessel 102. The vessel can be transformer tank, for instance, filled with transformer oil. The fluid communication between the bellow compensator 104 and the vessel 102 is provided by a connection pipe 110. The connection pipe may be attached to the vessel and the bellow compensator with rigid joints. Thereby the portion of the connection pipe 110 between the joints of the bellow compensator and the vessel may correspondingly be rigid without need for bending or flexing after manufacturing.

As FIG. 1 shows, the connection pipe 110 may enter the bellow compensator 104 through the bottom wall of the compensator. In an exemplary embodiment, the pipe enters the compensator in a direction which is perpendicular to the direction of the mounting structure 112. In such a way, it is possible to extend the height of the pipe inside the compensator as the pipe extends parallel to the extension/contraction direction of the compensator. Furthermore, the connection pipe may enter the vessel 102 also perpendicularly to the wall of the vessel. Other directions than perpendicular direction are possible as regards the pipes entering the pressure compensator and/or the vessel.

As shown in FIG. 1, the bottom of the bellow may be arranged fixedly with respect to the vessel. This can be made by fixing the bottom wall 104C of the bellow compensator 104 to a horizontal mounting level 112, which is fixed to the vessel.

The compensator 104 is thus allowed to expand and contract such that its top wall 104A may move in the vertical direction, and its foldable side walls 104B may straighten and fold depending on the fluid volume within the compensator.

In FIG. 1, the bellow compensators are mounted to the side wall 102A of the vessel 102 but in another exemplary embodiment, the bellow compensator 104 may be arranged to the roof 102B of the vessel 102. In such an embodiment, the bottom wall of the bellow compensator can be arranged fixedly at least substantially against the top wall of the vessel whereby the bellow compensator is allowed to flex from its upper side. In this kind of embodiment, the connection pipe may be a direct pipe, which extends from the top part of the bellow compensator to the bottom part of the vessel 102.

The mounting arrangements of the pressure compensator, wherein the bottom of the pressure compensator is fixed, thus allow the compensator to be arranged to the side and/or the top of the installation thereby providing different mounting alternatives for the compensator with respect to the vessel.

In the exemplary embodiment shown in FIG. 1, the compensator has a rigidly arranged bottom. In another exemplary embodiment, the bellow compensator has a top wall which is rigidly arranged with respect to the vessel. The expansive and contracting movement of the bellow for compensating the volume variation of the insulating fluid can be provided by the bottom wall. In such an embodiment, the connecting hose between the compensator and the vessel needs to flexible, and can be a hose-like pipe. The hose is arranged stationary with respect to the bottom wall of the bellow, thus following the movement of the wall. The connection pipe is at least partly flexible, that is there is at least one section of the fluid connection pipe between the bellow compensator and the vessel which is flexible.

In another exemplary embodiment, the flexible pipe may be usable when the compensator arrangement is arranged such that it may move as a whole with respect to the vessel.

The end 110A of the connection pipe 110, which connects the vessel to the bellow compensator 104, is arranged such that the end 110A extends above the bottom level 104C of the bellow. As FIG. 1 shows, there is an opening in the bottom wall of the bellow through which the pipe enters the bellow. The connection pipe is fixedly mounted to the bottom wall of the compensator, that is, they do not move with respect to each other.

The pipe does not end to the bottom of the bellow but there is a pipe section that extends to a predetermined distance from the bottom of the bellow. In this way, oil that is fed from the pressure compensator to the vessel is taken from the upper part of the pressure compensator being the driest part of the compensator as the most of the moisture due to a possible leak remains close to the bottom of the compensator.

In an exemplary embodiment, the position of the end opening 110A of the pipe is determined by means of the bellow being contracted, for example, in its maximally contracted state. That is, in the contracted state of the bellow, the end 110A of the pipe is in immediate proximity of the top wall 104A of the bellow. There is, however, a small gap between the end of the pipe and the top wall of the bellow such that fluid communication via the end of the pipe is maintained. Thus, the end of the pipe does not also hinder the movement of the bellow in any position. The movement of the top wall 104A may be limited by a stoppage member, which can prevent lowering of the top wall below a predetermined level. In an exemplary embodiment, the movement of the top wall may be guided by guiding rods exterior or interior of the bellow. These rods may be provided with protrusions, for instance, which stop the lowering of the top wall to a level which would prevent fluid flow via the open end of the connecting pipe. In addition to stoppage members, which prevent the top wall from blocking the pipe end, there may also be provided stoppage members, which prevent the bellow from expanding too much.

The pipe extends above the bottom wall level of the compensator in the embodiments discussed above; that is, when the bottom wall is rigid with respect to the vessel and the compensation movement occurs by the top wall of the compensator, and in an inverse structure where the top wall is rigid and the compensatory movement is provided by the bottom wall of the compensator.

In this way, if a leakage occurs in the bellow compensator 104, the water, being heavier than oil, stays as long as possible below the level of the opening 110A of the pipe 110. The bellow compensator 104 may be provided with a sensor, below the level of the pipe end 110A, detecting the presence of water in the fluid, and warning equipment to provide a warning to a system supervisor of such an occurrence.

The other end 110B of the connection pipe 110 may be positioned at the lower part of the vessel 102, for example, as low as possible in the vessel to transmit the oil from the pressure compensator into the lowest and coldest area of the vessel. The end of the pipe may be in the lowest fifth, or lowest tenth part of the vessel. In an exemplary embodiment, the end of the pipe is only about 20 mm from the bottom of the vessel. In this way, if a leakage occurs in the bellow compensator 104, and water flows to the vessel 102 via the connection pipe 110, the water is led to the bottom of the vessel 102. The heavy water fed into the bottom area of the vessel 102 is thus prevented from detrimentally impacting as a hazard, at least for some time, the operation of the critical components of the installation, such as parts having electric potential, which can be substantially at the middle of the vessel 102. Similarly as in the case of the bellow compensator, the vessel 102 may be provided with water detection sensor at the bottom of the vessel such as to detect presence of water in the vessel as soon as possible.

As shown in the embodiment of FIG. 1, the fluid connection pipe may include only sections which extend downwards or horizontally when proceeding from the first end 110A of the fluid connection pipe 110 towards the second end 110B of the fluid connection pipe 110. In an alternative exemplary embodiment, there is provided an oil-lock, wherein a section of the pipe between the pressure compensator and the vessel is arranged higher than the rest of the pipe. The purpose with the oil-lock is to prevent water, heavier than oil, flowing from the compensator to the vessel in case of a leakage situation in the compensator.

Figure 2:
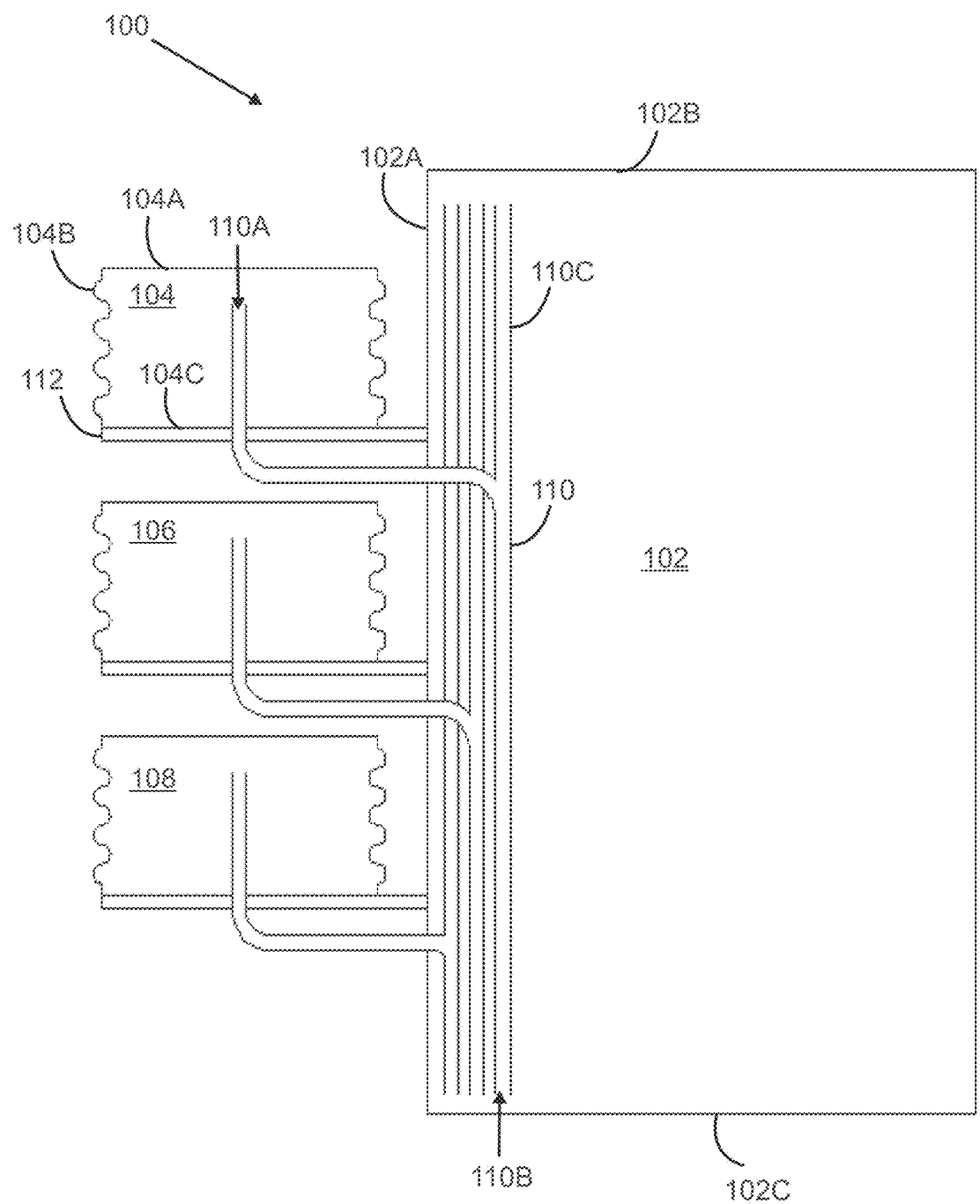
FIG. 2 shows another exemplary embodiment of a pressure compensation arrangement.
Figure 3:
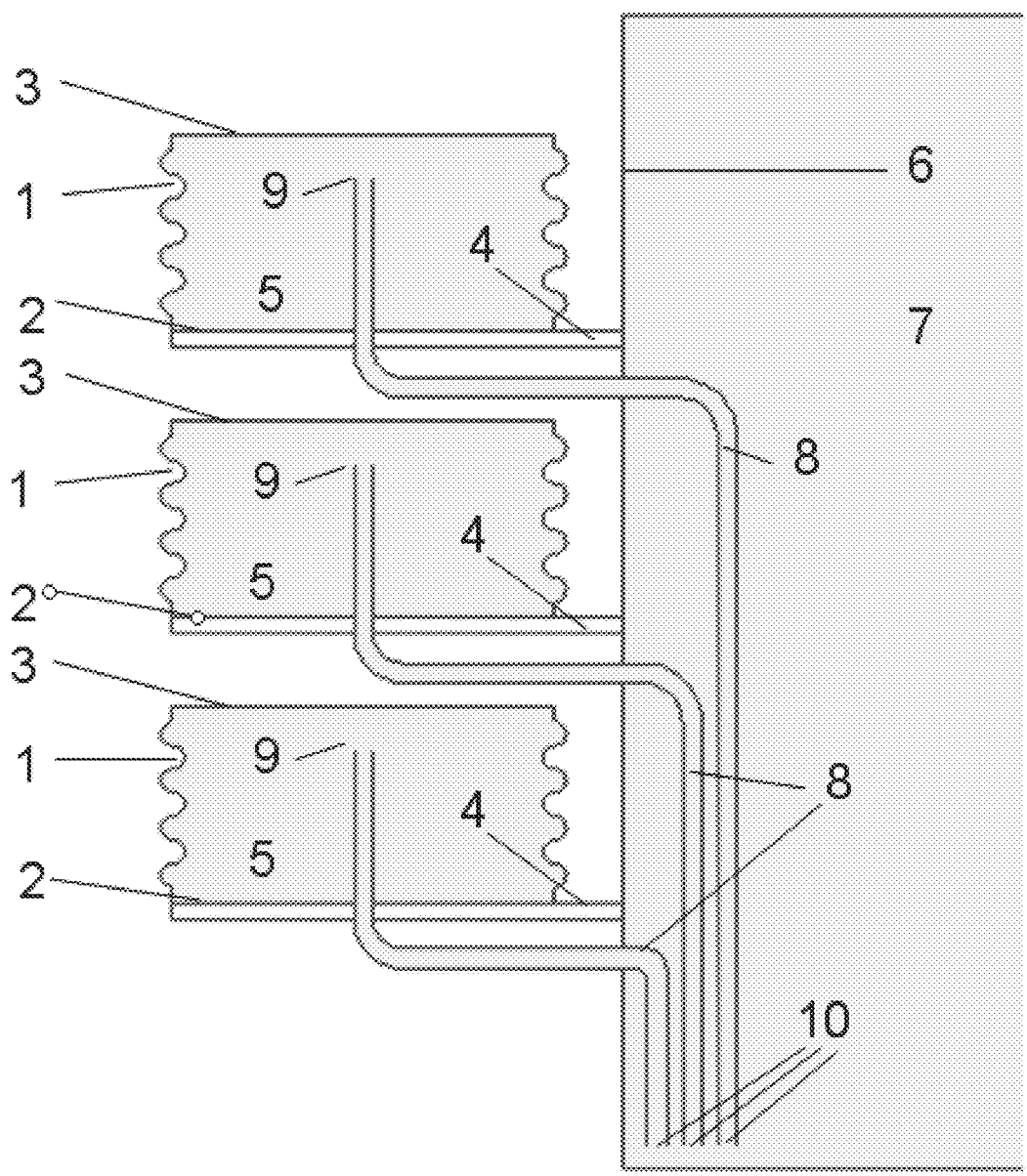
FIG. 3 corresponds to FIG. 1 but has corrected reference numbers, FIG. 3 having been filed as FIG. 1 in the priority application.
Figure 4:
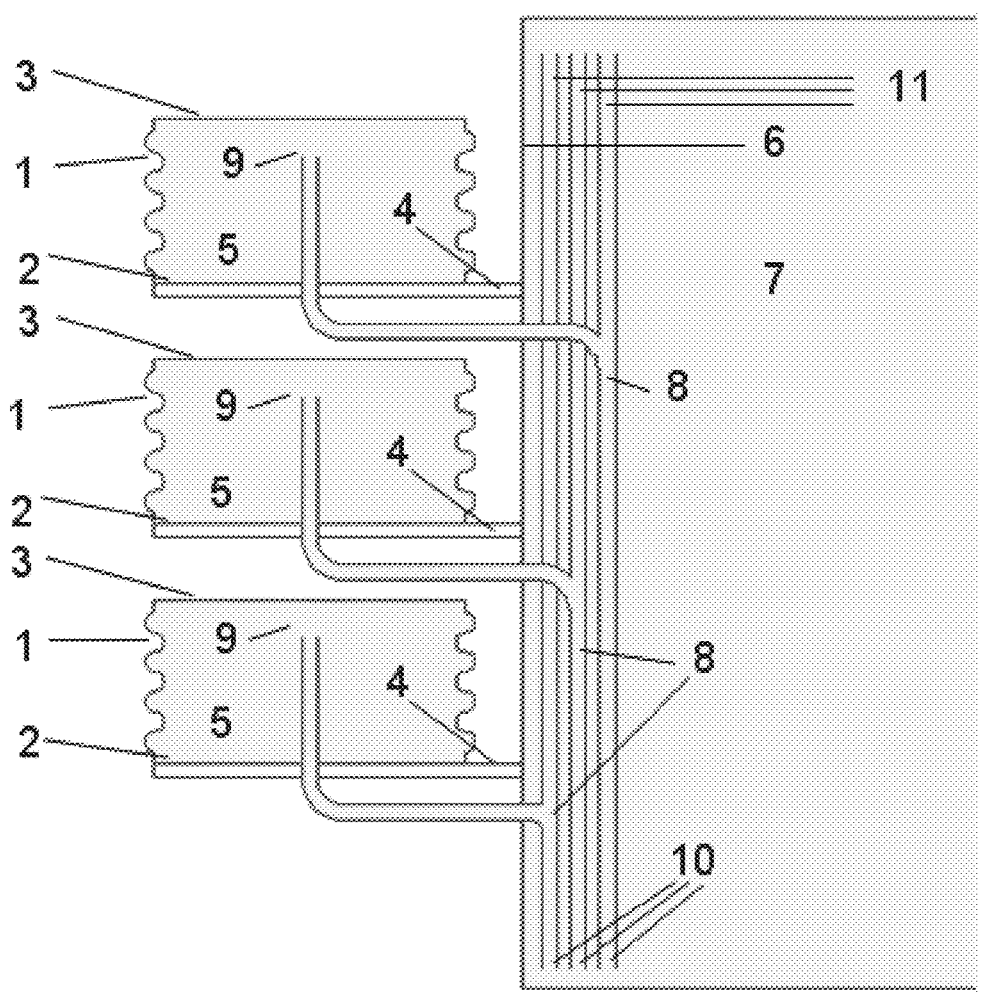
FIG. 4 corresponds to FIG. 2 but has corrected reference numbers, FIG. 4 having been filed as FIG. 2 in the priority application.

FIG. 2 shows another exemplary embodiment. In this embodiment, the piping 110 includes a straight portion 110C extending from the top of the vessel to the bottom of the vessel. This straight portion has an opening between the ends, which connects to a pipe which leads to bellow compensator 104. This facilitates the manufacture of the piping arranged inside the vessel as the curvature form presented in FIG. 1 is not needed.

The open end of the piping 110C provides also an exemplary important advantage that removing air from the insulating fluid being inside the tube 110 is facilitated during manufacture of the vessel. In the embodiment of FIG. 1, the principal escape outlet of air that resides in the pipe is at the ends of the pipes, which end in the bellows. FIG. 2 provides an additional route for the air to escape from the piping.

The piping shown in FIG. 2 is applicable also in the embodiment, where the bellow compensators are arranged to the roof 102B of the transformer. In such a case the branching pipes are not needed but the pipe can lead directly from the top to the bottom of the transformer.

Although FIGS. 1 and 2 show that each of the three bellow compensators has its own tubing within the vessel, the pipes from the different compensators may combine to a single pipe within the vessel.

Although the above embodiments show the pressure compensation arrangement implemented with bellow compensators, also other types of pressure compensators are applicable.

In an exemplary embodiment, the pressure compensator is a vertically arranged cylinder housing a piston, which can move vertically due to the volume variations of the insulating/cooling fluid. Below the piston is arranged a fluid space for the insulating fluid and above the piston is a seawater space. The piston is sealed such that mixing of the insulating fluid and seawater is prevented. A principle of operation in this embodiment is similar to the embodiments shown in FIGS. 1 and 2. That is, the connecting pipe connecting the vessel and the cylinder, extends above the bottom of the cylinder. For example, the pipe extends so high that is very close to the horizontal piston level when the piston is in its lowest possible position.

In still another exemplary embodiment, the pressure compensator is a bottle compensator having a flexible bag inside. The fluid connector, for other than water, is arranged to the bottom of the bottle. In this embodiment, the flexible bag contains the insulating fluid and the surrounding bottle contains seawater. The connecting pipe from the vessel enters the bottle from the bottom of the bottle, and extends a predetermined distance above the bottom of the bottle. There may be provided a protective member at the end of the pipe, which prevents the pipe from breaking the flexible bag when being in its collapsed state.

It will be apparent to those skilled in the art that, as the technology advances, concepts disclosed herein can be implemented in various ways. The invention and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A subsea pressure compensation arrangement, comprising:
   a vessel filled with fluid;
   a pressure compensator for compensating volume variations of the fluid, the pressure compensator comprises a top wall, which is mounted stationary with respect to the vessel, and a bottom wall which is configured to move vertically to compensate for the volume variations of the fluid, wherein the fluid connection pipe is arranged stationary relative to the bottom wall and configured to move together with the bottom wall of the pressure compensator; and
   wherein there is at least one flexible fluid connection pipe for fluid communication between the vessel and the pressure compensator, wherein the fluid connection pipe is connected to a bottom wall of the pressure compensator with a pipe opening arranged at an end of the fluid connection pipe extending above a level of the bottom wall of the pressure compensator, the pressure compensator being a bellow compensator having one or more foldable and/or flexible side walls for allowing volume variations of the bellow compensator, and the pipe opening of the fluid connection pipe being arranged in a proximity of, but separate from, a top wall of the bellow compensator when the bellow compensator is in its contracted state.

2. A subsea pressure compensator arrangement according to claim 1, wherein the fluid connection pipe enters the pressure compensator substantially perpendicularly to the bottom wall of the pressure compensator.

3. A subsea pressure compensator arrangement according to claim 1, wherein the fluid connection pipe extends inside the compensator parallel to an extension/contraction direction of the bellow compensator.

4. A subsea pressure compensator arrangement according to claim 1, wherein the fluid connection pipe has an opening at an end of the pipe substantially at the bottom of vessel.

5. A subsea pressure compensator arrangement according to claim 1, wherein the fluid connection pipe comprises:
   only sections which extend downwards or horizontally when proceeding from a first end of the pipe opening of the fluid connection pipe towards a second end of the fluid connection pipe.

6. A subsea pressure compensator arrangement according to claim 1, wherein the fluid connection pipe inside the vessel comprises:
   a straight pipe section extending from a bottom part of the vessel to a top part of the vessel, the straight pipe section having open top and bottom ends.

7. A subsea pressure compensator arrangement according to claim 6, wherein the straight pipe section comprises:
   an opening for a pipe connection towards the bellow compensator, which opening is arranged between the open top and bottom ends of the straight pipe section.

8. A subsea pressure compensator arrangement according to claim 1, wherein a side wall of the bellow compensator is made of the metal or rubber.

9. A subsea electric installation, comprising:
   a subsea pressure compensator arrangement according to claim 1.

10. A subsea electric installation according to claim 9, wherein the subsea electric installation is a transformer.

* * * * *